(12) United States Patent
Maier et al.

(10) Patent No.: US 11,079,409 B2
(45) Date of Patent: Aug. 3, 2021

(54) ASSEMBLY WITH AT LEAST TWO REDUNDANT ANALOG INPUT UNITS FOR A MEASUREMENT CURRENT

(71) Applicant: Siemens Aktiengesellschaft, Munich (DE)

(72) Inventors: Willi Maier, Oppenau (DE); Norbert Rottmann, Landau (DE)

(73) Assignee: Siemens Aktiengesellschaft, Munich (DE)

( * ) Notice: Subject to any disclaimer, the term of this patent is extended or adjusted under 35 U.S.C. 154(b) by 375 days.

(21) Appl. No.: 16/089,779

(22) PCT Filed: Mar. 28, 2017

(86) PCT No.: PCT/EP2017/057284
§ 371 (c)(1),
(2) Date: Sep. 28, 2018

(87) PCT Pub. No.: WO2017/167732
PCT Pub. Date: Oct. 5, 2017

(65) Prior Publication Data
US 2020/0309821 A1    Oct. 1, 2020

(30) Foreign Application Priority Data
Mar. 30, 2016 (EP) ..................................... 16162780

(51) Int. Cl.
*G01R 15/14* (2006.01)
*G01R 1/20* (2006.01)
*G01R 15/00* (2006.01)

(52) U.S. Cl.
CPC ........... *G01R 15/146* (2013.01); *G01R 1/203* (2013.01); *G01R 15/002* (2013.01)

(58) Field of Classification Search
CPC ..... G01R 15/146; G01R 15/002; G01R 1/203
See application file for complete search history.

(56) References Cited

U.S. PATENT DOCUMENTS

| | | | |
|---|---|---|---|
| 2004/0260501 A1 | 12/2004 | Fey et al. | |
| 2011/0241654 A1 | 10/2011 | Richards | |
| 2016/0371212 A1* | 12/2016 | Griesbaum | G05B 19/0423 |

FOREIGN PATENT DOCUMENTS

| | | |
|---|---|---|
| CN | 102187235 | 9/2011 |
| CN | 104377808 | 2/2015 |

(Continued)

OTHER PUBLICATIONS

Office Action issued in Chinese Patent Application No. 2017800180078.
(Continued)

*Primary Examiner* — Clayton E. LaBalle
*Assistant Examiner* — Michael A Harrison
(74) *Attorney, Agent, or Firm* — Cozen O'Connor

(57) ABSTRACT

At least two redundant analog input units for a measurement current have analog inputs which are connected in parallel and upon which voltage measuring devices directly lie to convert respectively applied voltages into a digital measurement value, wherein in order to detect errors, in particular in order to detect wire breakage, each analog input unit compares its generated measurement value with a threshold and outputs an error message if a measurement value is detected that falls below the threshold, where if the analog input of the analog input unit is in the low-resistance state, then the at least one other analog input unit is additionally caused to assume a current-measuring function and switch the analog input of the analog input unit to a low-resistance state.

12 Claims, 2 Drawing Sheets

(56) References Cited

FOREIGN PATENT DOCUMENTS

| CN | 104483586 | 4/2015 | |
|---|---|---|---|
| CN | 105305801 | 2/2016 | |
| WO | WO03/039904 | 5/2003 | |
| WO | WO2015/128336 | 9/2015 | |
| WO | WO-2015128336 A1 * | 9/2015 | ......... G06F 13/4027 |

OTHER PUBLICATIONS

International Search Report based on PCT/EP2017/057284 dated Jun. 13, 2017.

* cited by examiner

ASSEMBLY WITH AT LEAST TWO REDUNDANT ANALOG INPUT UNITS FOR A MEASUREMENT CURRENT

CROSS-REFERENCE TO RELATED APPLICATIONS

This is a U.S. national stage of application No. PCT/EP2017/057284 filed Mar. 28, 2017. Priority is claimed on EP Application No. 16162780 filed Mar. 30, 2016, the content of which is incorporated herein by reference in its entirety.

BACKGROUND OF THE INVENTION

1. Field of the Invention

The invention relates to an assembly with at least two redundant analog input units for a measurement current, having parallel-connected analog entry points for the measurement current, and containing in each case a current-measuring resistor, a voltage-measuring device with a high-ohmic voltage-measuring entry point, for converting a voltage that is applied to the voltage-measuring entry point into a digital measurement value, a digital output for outputting the digital measurement value, and a controllable switching device for switching the analog entry point between a high-ohmic state and a low-ohmic state, where in the low-ohmic state the current-measuring resistor is situated at both the analog entry point and the high-ohmic voltage-measuring entry point, and where the analog input units are connected together via a communication connection and are designed to select one of the analog input units, which switches its analog entry point into the low-ohmic state in order to measure and convert the measurement current into a digital measurement value while the analog entry point in each remaining analog input unit is switched into the high-ohmic state.

2. Description of the Related Art

WO 2015/128336 A1 discloses an assembly having two redundant input units that are each operated as either an analog input unit for a measurement current or a binary input unit for a voltage. In order to switch between these two operating states, each input unit contains a switching device in which a parallel circuit comprising a high-ohmic resistor and a controllable switch is situated in series with the low-ohmic current-measuring resistor at the entry point of the input unit. The voltage-measuring entry point of the voltage-measuring device is situated at the current-measuring resistor.

In redundant operation as binary input units, the controllable switch is open in both input units, such that the high-ohmic resistor and the low-ohmic current-measuring resistor form a voltage divider and the voltage-measuring device measures a high or low level of the voltage that is applied to the entry point of the respective binary input unit.

In redundant operation as analog input units for a measurement current, the controllable switch is closed in at least one of the two input units, such that the high-ohmic resistor is disabled. If the controllable switch is closed in both input units, the measurement current is divided into halves over the two low-ohmic current-measuring resistors, such that the voltage measuring devices downstream thereof each measure half of the measurement current as a voltage drop over their low-ohmic current-measuring resistor. The respective input unit then makes an arithmetic correction by the factor of 2 before it outputs the digital measurement value of the measurement current. If the controllable switch is closed in only one of the two input units, then the measurement current is divided in another ratio over the current-measuring resistor in the input unit with the closed switch and over the series circuit of the resistors in the other input unit, such that the voltage measuring devices downstream thereof measure the corresponding portions of the measurement current as voltage drops over their low-ohmic current-measuring resistors. Here, likewise, e.g., the input unit with the closed switch makes an arithmetic correction by the ratio of the distribution of the measurement current over the redundant input units before it outputs the digital measurement value. A desired distribution of the measurement current in the ratio of 97% to 3% is obtained with a resistance ratio of 1 to 31.33 between the current-measuring resistor and the high-ohmic resistor. However, the precision of the distribution of the measurement current over the specified resistance ratio, and therefore the precision of the arithmetic measurement value correction, is limited by the unavoidable and unknown line resistances between the two analog input units.

A communication connection exists between the two redundant input units of the conventional assembly. With the communication connection, the two redundant input units detect whether a redundancy partner is present in each case. That is, the redundant units select which of them executes the measurement tasks as master and, if the master fails, assign the corresponding function to the other input unit respectively. WO 03/039904 A2 discloses a semiconductor switch for switching, e.g., an inductive load. The semiconductor switch is a sense-FET that captures a partial current that is proportional to the load current via a measurement resistor. In order to achieve greater operational safety, the partial current is additionally (redundantly) measured by capturing the resulting voltage drop at the measurement resistor via a signal amplifier and converting it into a digital measurement value. This can be evaluated with reference to a predetermined upper and/or lower threshold value by generating a logical high or logical low signal if the threshold value is exceeded or not reached. In addition to the redundant current measurement, the operational safety can be further increased by using two or more sense-FETs to connect the same load. The sense-FETs with the redundant current measurement can also be arranged in different current circuits (drive current circuit and freewheeling current circuit) of the inductive load. Switching of an analog entry point between a high-ohmic state and a low-ohmic state is not provided.

SUMMARY OF THE INVENTION

With the assembly disclosed in WO 2015/128336 A1 as a starting point, it is an object of the present invention to provide a redundant analog input unit for a measurement current, which does not require arithmetic correction of the measurement values that are determined.

This and other objects and advantages are achieved in accordance with the invention by an assembly in which, within each analog input unit, the high-ohmic voltage-measuring entry point of the voltage-measuring device is directly connected to the analog entry point and each of the at least two analog input units is configured to compare, in both the high-ohmic and low-ohmic state of its analog entry point, its currently generated digital measurement value with a threshold value, to output an error message if the digital measurement value falls below the threshold value and, if its analog entry point is in the low-ohmic state, to cause another of the analog input units to switch its analog entry point into the low-ohmic state to measure and convert the measurement current into a digital measurement value.

The voltage-measuring entry point of the voltage-measuring device in each analog input unit is situated directly at the analog entry point. Consequently, all redundant analog input units measure practically the same voltage, i.e., the voltage drop at the current-measuring resistor of that analog input unit whose analog entry point is switched into the low-ohmic state. In contrast with the assembly disclosed in WO 2015/128336 A1 cited in the introduction, no voltage division occurs, and therefore the resistance ratio between the high-ohmic resistor and the current-measuring resistor is not relevant and can therefore be set not only higher, but in practice can be set significantly higher by a factor greater than 1000, and consequently there is no division, or only negligible division in terms of measuring accuracy, of the measurement current onto the redundant analog input unit.

All redundant analog input units capture at least approximately the same voltage drop as explained above. Consequently, they can monitor themselves to the extent that each analog input unit, irrespective of whether its analog entry point is switched into the low-ohmic or high-ohmic state in each case, converts the voltage applied to its analog entry point into a digital measurement value and compares this with a threshold value. Therefore, in the event of an interruption of voltage or current at the analog entry point of an analog input unit, the voltage captured by the voltage-measuring entry point of the voltage-measuring device drops below the threshold value to the value zero. Such an interruption may be caused by an error, such as a line break, but also by removal of the current-measuring analog input unit from a rack, such as for calibration or as a result of a module replacement. This is then detected automatically and results in the relevant analog input unit outputting an error message instead of a measurement value. In this case, it may take the form of a value that lies outside the valid measuring range or an information item, such as a bit, which indicates that the measurement value is incorrect. If the analog input unit concerned is the current-measuring analog input unit whose analog entry point is switched into the low-ohmic state at that time, then it outputs a detection signal onto the communication connection so as to cause another or the other redundant analog input unit to switch its analog entry point into the low-ohmic state and to assume the current-measuring function. In addition, the previous current-measuring analog input unit preferably switches its analog entry point into the high-ohmic state.

All redundant analog input units ideally measure the same voltage drop, such that in principle each analog input unit can convert the voltage it has captured into a digital measurement value for the measurement current and output this via its digital output. However, because in practice only the current-measuring resistors are formed as precision resistors and non-negligible line resistances may be present between the analog entry points of the various analog input units, it can no longer be readily assumed in the case of very high demands with respect to both the measuring discrimination and measuring accuracy, that the measurement values generated by the analog input unit or units with analog entry points switched into the high-ohmic state will satisfy said demands. For this case, the analog input units are preferably configured, when in the high-ohmic state of their analog entry point, instead of the measurement value that was generated locally, to receive via the communication connection and then to output the digital measurement value that was generated by the current-measuring analog input unit having the low-ohmic analog entry point.

The fact that the analog input units perform self-monitoring is particularly advantageous if, in order to provide redundancy for the transfer of the measurement current, the redundant analog input units are connected via separate lines to a measurement current sensor (e.g., 4-20 mA measurement transformer) which supplies the measurement current. Each of the separate lines is then monitored for wire breakage.

As explained above, it is an essential feature of the invention that the voltage-measuring entry point of the voltage-measuring device is situated directly at the analog entry point in each analog input unit. This can be achieved by including a series circuit in the switching device, where the series circuit consists of the current-measuring resistor and a controllable switch and is situated in parallel with a high-ohmic resistor at the analog entry point and the voltage-measuring entry point. Alternatively, the switching device includes a parallel circuit, this consisting of a high-ohmic resistor and a controllable switch and being situated in series with the current-measuring resistor at the analog entry point and the voltage-measuring entry point.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to explain the invention further, reference is made below to the figures in the drawing, in which.

DETAILED DESCRIPTION OF THE EXEMPLARY EMBODIMENTS

Identical reference signs have the same significance in the various figures.

Figure 1:
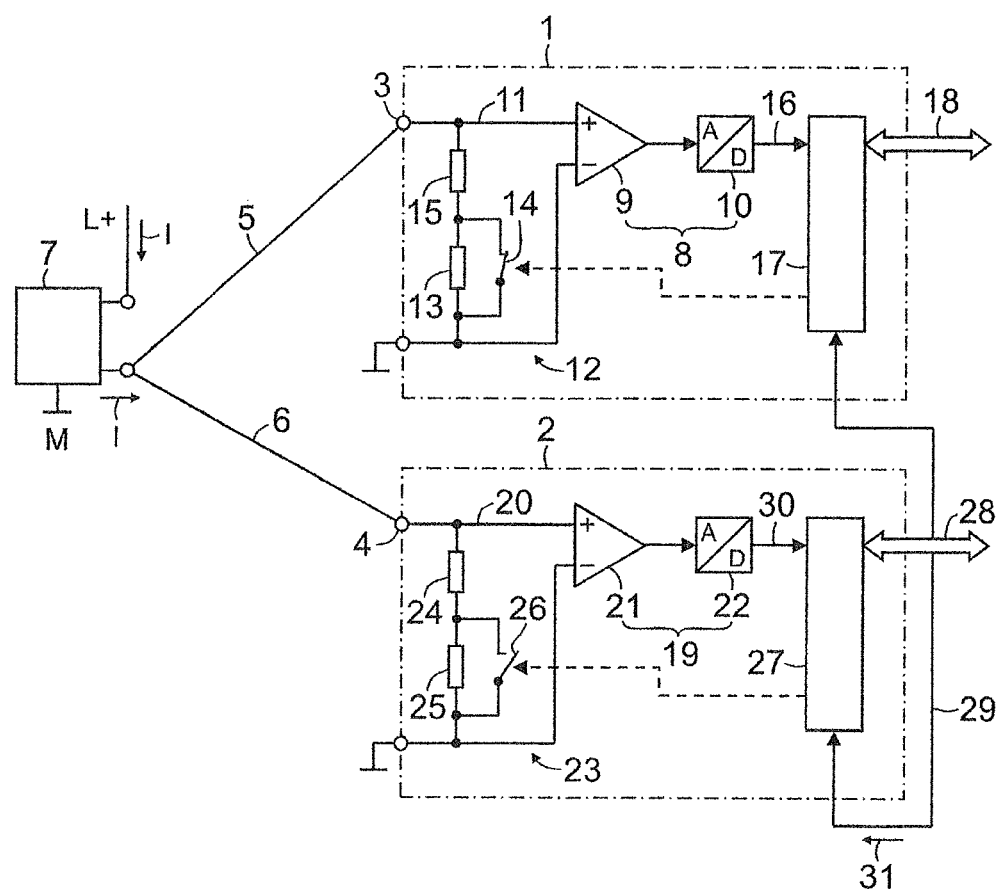
FIG. 1 schematically shows a first exemplary embodiment of the assembly in accordance with the invention.

FIG. 1 shows two redundantly operating analog input units 1, 2 that, at their analog entry points 3, 4, are connected in parallel via separate lines 5, 6 to a measurement current sensor 7. The measurement current sensor 7 is a measurement transformer, for example, which generates a measurement current I between 4 and 20 mA that is proportional to a measured variable which has been captured.

The analog input unit 1 contains a voltage-measuring device 8 which consists of a difference amplifier 9 and an analog/digital converter 10 downstream thereof, and which with its voltage-measuring entry point 11 is situated directly at the analog entry point 3, i.e., the analog entry point 3 is the voltage-measuring entry point 11. The analog entry point 3 can be switched via a controllable switching device 12 between a high-ohmic state and a low-ohmic state. The switching device 12 consists of a parallel circuit comprising a high-ohmic resistor 13 and a controllable switch 14, situated in series with a low-ohmic current-measuring resistor 15 at the analog entry point 3 or voltage-measuring entry point 11. The current-measuring resistor 15 is formed as a precision resistor and has a resistance value of 250Ω, for example. The high-ohmic resistor 13 has a resistance value of 1 MΩ, for example. If the switch 14 is closed, i.e., in the low-ohmic state of the analog entry point 3, then the voltage-measuring device 8 captures the voltage drop that is generated by the measurement current I over the current-measuring resistor 15, and converts this into a digital measurement value 16 for the measured variable that has been captured. The digital measurement value 16 is output by a control device (CPU) 17 via a digital output 18 as an interface to a supervisory controller that is not shown here. The control device 17 also controls the switching device 12.

The second analog input unit 2 is structurally identical to the analog input unit 1 and contains a voltage-measuring device 19 whose high-ohmic voltage-measuring entry point 20 coincides with the analog entry point 4 and which consists of a difference amplifier 21 and an analog/digital converter 22 downstream thereof. A switching device 23 with a low-ohmic current-measuring resistor 24 in series with a parallel circuit comprising a high-ohmic resistor 25 and a controllable switch 26 is situated at the analog entry point 4 or voltage-measuring entry point 20. This switching device 23 is controlled by a control device 27, which also outputs a digital measurement value via a digital output 28.

The control devices 17, 27 of the two redundant analog input units 1, 2 communicate with each other via a communication connection 29, such as RS-485, and ensure that the analog entry point 3 is only ever switched into the low-ohmic state in one of the two analog input units 1, 2, such as the analog input unit 1, here. In the other and if applicable every other redundant analog input unit 2, the switch 26 is open and the analog entry point 4 is switched into the high-ohmic state accordingly. While the analog input unit 1 measures the measurement current I, converts it into the digital measurement value 16 and outputs it, the analog input unit 2 merely monitors the voltage at its analog entry point 4, for which purpose the voltage is likewise converted into a digital measurement value 30. Due to its very high resistance value, the resistor 25 has no negative effect or only a negligible negative effect on the current measurement in the analog input unit 1. The voltage measured by the voltage-measuring device 19 of the analog input unit 2 corresponds to the voltage drop over the current-measuring resistor 15 in the analog input unit 1 plus the voltage drop caused by the measurement current I over the line 5. The last cited voltage drop is not negligible in terms of measuring accuracy. As a result, the analog input unit 2 accepts the digital measurement value 16 that was generated by the current-measuring analog input unit 1 and communicated via the communication connection 29, and redundantly outputs same instead of its own measurement value 30 via its digital output 28.

In both analog input units 1, 2, the respective control device 17, 27 compares the generated digital measurement value 16, 30 with a predetermined threshold value. If there is an interruption of the line 6, the voltage drops to the value zero at the analog entry point 4 or the voltage-measuring entry point 20, and therefore the digital measurement value 30 falls below the predetermined threshold value. In this case, instead of the measurement value 16 received from the current-measuring analog input unit 1 via the communication connection 29, an error message is output or the output measurement value 16 is flagged as incorrect.

Conversely, if a wire breakage is detected at the current-measuring analog input unit 1, an error message is likewise output via the digital output 18. The analog entry point 3 is switched into the high-ohmic state by means of opening the switch 14 and, by outputting a detection/command signal 31 via the communication connection 29, the redundant analog input unit 2 is caused to switch its analog entry point 4 into the low-ohmic state, to assume the current-measuring function, and to transfer the generated measurement values 30 to the analog input unit 1 via the communication connection 29.

Figure 2:
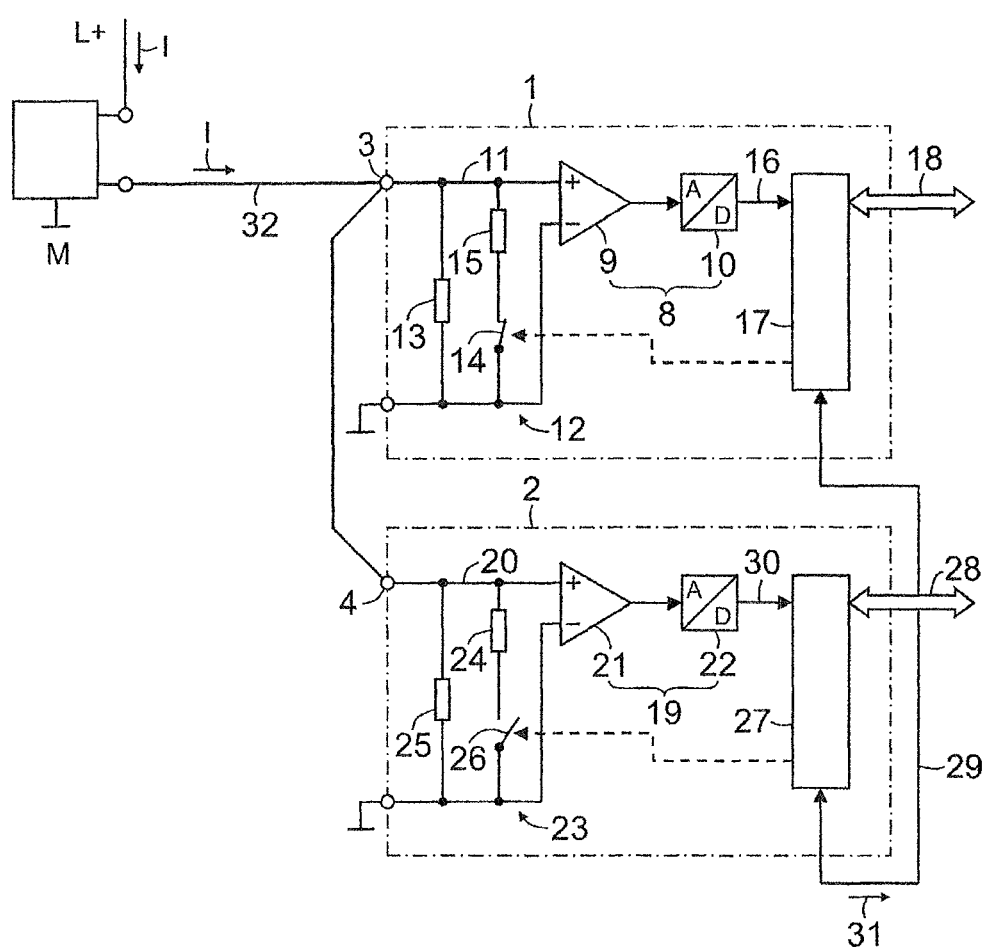
FIG. 2 schematically shows a second exemplary embodiment of the assembly in accordance with the invention.

The exemplary embodiment shown in FIG. 2 differs from that shown in FIG. 1, firstly in that the two analog input units 1, 2 are wired in parallel directly at their analog entry points 3, 4 and connected to the measurement current sensor 7 via a line 32, and secondly in that the switching devices 12, 23 each have a series circuit which consists of the current-measuring resistor 15, 24 and the controllable switch 14, 26 and which is situated in each case in parallel with the high-ohmic resistor 13, 25 at the analog entry point 3, 4 and the voltage-measuring entry point 11, 20. Both modifications are independent of each other and can also be realized singly in each case.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An assembly with at least two redundant analog input units for a measurement current, comprising:
   parallel-connected analog entry points for the measurement current, and comprising for each parallel-connected analog entry point:
   a current-measuring resistor;
   a voltage-measuring device with a high-ohmic voltage-measuring entry point for converting a voltage applied to the voltage-measuring entry point into a digital measurement value;
   a digital output for outputting the digital measurement value; and
   a controllable switching device for switching the analog entry point between a high-ohmic state and a low-ohmic state, the current-measuring resistor being situated at both the analog entry point and the high-ohmic voltage-measuring entry point in the low-ohmic state, and the at least two redundant analog input units being connected together via a communication connection and being configured to select one of the analog input units, which switches its analog entry point into the low-ohmic state to measure and convert the measurement current into a digital measurement value while the analog entry point in each remaining redundant analog input unit is switched into the high-ohmic state;

wherein the high-ohmic voltage-measuring entry point of the voltage-measuring device within each of the at least two redundant analog input units is directly connected to the analog entry point; and wherein each of the at least two redundant analog input units is configured to compare, in both the high-ohmic and low-ohmic state of its analog entry point, its currently generated digital measurement value with a threshold value, to output an error message if the digital measurement value falls below the threshold value and, if its analog entry point is in the low-ohmic state, to cause another of the analog input units to switch its analog entry point into the low-ohmic state to measure and convert the measurement current into a digital measurement value.

2. The assembly as claimed in claim 1, wherein each analog input unit is further configured, when in the low-ohmic state of its analog entry point, to switch said analog entry point into the high-ohmic state if the digital measurement value falls below the threshold value.

3. The assembly as claimed in claim 1, wherein each redundant analog input unit is further configured, when in the high-ohmic state of its analog entry point, instead of the locally generated measurement value, to output the digital measurement value generated by the redundant analog input unit having the low-ohmic analog entry point and received therefrom via the communication connection.

4. The assembly as claimed in claim 2, wherein each redundant analog input unit is further configured, when in the high-ohmic state of its analog entry point, instead of the locally generated measurement value, to output the digital measurement value generated by the redundant analog input unit having the low-ohmic analog entry point and received therefrom via the communication connection.

5. The assembly as claimed in claim 1, wherein the switching device comprises a series circuit consisting of the current-measuring resistor and a controllable switch; wherein said series circuit is operable coupled in parallel with a high-ohmic resistor at the analog entry point and the voltage-measuring entry point.

6. The assembly as claimed in claim 2, wherein the switching device comprises a series circuit consisting of the current-measuring resistor and a controllable switch; wherein said series circuit is operably coupled in parallel with a high-ohmic resistor at the analog entry point and the voltage-measuring entry point.

7. The assembly as claimed in claim 3, wherein the switching device comprises a series circuit consisting of the current-measuring resistor and a controllable switch; wherein said series circuit is operably coupled in parallel with a high-ohmic resistor at the analog entry point and the voltage-measuring entry point.

8. The assembly as claimed in claim 1, wherein the switching device comprises a parallel circuit consisting of a high-ohmic resistor and a controllable switch, said parallel circuit being operably coupled in series with the current-measuring resistor at the analog entry point and the voltage-measuring entry point.

9. The assembly as claimed in claim 2, wherein the switching device comprises a parallel circuit consisting of a high-ohmic resistor and a controllable switch, said parallel circuit being operably coupled in series with the current-measuring resistor at the analog entry point and the voltage-measuring entry point.

10. The assembly as claimed in claim 3, wherein the switching device comprises a parallel circuit consisting of a high-ohmic resistor and a controllable switch, said parallel circuit being operably coupled in series with the current-measuring resistor at the analog entry point and the voltage-measuring entry point.

11. The assembly as claimed in claim 1, wherein the at least two redundant analog input units are connected via separate lines to a measurement current sensor supplying the measurement current.

12. The assembly as claimed in claim 1, wherein the at least two redundant analog input units are wired in parallel at their respective analog entry points and connected via a line to a measurement current sensor supplying the measurement current.

\* \* \* \* \*